United States Patent
Li et al.

(10) Patent No.: US 11,114,646 B2
(45) Date of Patent: Sep. 7, 2021

(54) ORGANIC LIGHT EMITTING DISPLAY PANEL AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Qian Li, Beijing (CN); Bing Zhang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 19 days.

(21) Appl. No.: 16/417,900

(22) Filed: May 21, 2019

(65) Prior Publication Data

US 2020/0020887 A1 Jan. 16, 2020

(30) Foreign Application Priority Data

Jul. 13, 2018 (CN) .......................... 201810768880.5

(51) Int. Cl.
*H01L 51/52* (2006.01)
*G02B 5/30* (2006.01)
*H01L 27/32* (2006.01)

(52) U.S. Cl.
CPC ........ *H01L 51/5281* (2013.01); *G02B 5/3016* (2013.01); *H01L 27/3244* (2013.01); *H01L 51/5253* (2013.01)

(58) Field of Classification Search
CPC ............. H01L 51/5281; H01L 51/5253; H01L 27/3244; G02B 5/3016
(Continued)

(56) References Cited

U.S. PATENT DOCUMENTS

2008/0239221 A1  10/2008  Shan et al.
2017/0207279 A1  7/2017  Zeng et al.
(Continued)

FOREIGN PATENT DOCUMENTS

CN  101276086 A  10/2008
CN  101414022 A  4/2009
(Continued)

OTHER PUBLICATIONS

Office Action corresponding to Chinese Application No. 201810768880.5 dated Mar. 3, 2020.
(Continued)

*Primary Examiner* — Nathanael R Briggs
*Assistant Examiner* — William D Peterson
(74) *Attorney, Agent, or Firm* — Arent Fox LLP; Michael Fainberg

(57) ABSTRACT

An organic light emitting display panel and a display device are provided. The organic light emitting display panel includes a substrate, a plurality of organic light emitting diode elements in an array on one side of the substrate, a phase compensation film on a side of the organic light emitting diode elements away from the substrate, and a circular polarizer on a side of the phase compensation film away from the organic light emitting diode elements, wherein the phase compensation film compensates for phase retardation amounts of the circular polarizer at all viewing angles, so that a phase retardation amount of light obliquely passing through the circular polarizer and the phase compensation film is substantially consistent with that of light perpendicularly passing through the circular polarizer and the phase compensation film.

10 Claims, 4 Drawing Sheets

(58) Field of Classification Search
USPC .......................................................... 349/123
See application file for complete search history.

(56) References Cited

U.S. PATENT DOCUMENTS

2017/0261793 A1* 9/2017 Son .................... G02F 1/133553
2017/0336546 A1* 11/2017 Ohyama ............. H01L 51/5265

FOREIGN PATENT DOCUMENTS

| CN | 106374053 | 2/2017 |
| CN | 107179624 A | 9/2017 |
| CN | 110244477 A | 9/2019 |

OTHER PUBLICATIONS

Office Action corresponding to Chinese Application No. 201810402120.2 dated May 15, 2020.

* cited by examiner

ORGANIC LIGHT EMITTING DISPLAY PANEL AND DISPLAY DEVICE

CROSS-REFERENCES TO RELATED APPLICATION

This application claims priority to Chinese patent application No. 201810768880.5 filed on Jul. 13, 2018, which is incorporated herein by reference in its entirety.

FIELD

The present disclosure relates to the field of display technologies, particularly to an organic light emitting display panel and a display device.

BACKGROUND

An organic light emitting diode (OLED) display panel, characterized with high response speed, thinness, and light weight, has been applied to fields such as mobile display devices and televisions. Generally, an OLED display panel includes a plurality of OLED light-emitting elements that each includes an anode, a cathode, and a light-emitting layer between the anode and the cathode. To resist ambient light reflection, a circular polarizer (a combination of a polarizing film and a λ/4 phase retardation film) is arranged on the light-emitting side of the OLED panel. External light becomes linearly polarized light after passing through the polarizing film; the linearly polarized light becomes circularly polarized light after passing through the λ/4 phase retardation film; a rotation diction of the circularly polarized light is reversed after being reflected by an electrode; the direction-reversed circularly polarized light becomes linearly polarized light after passing through the λ/4 phase retardation film layer again, wherein a difference between a polarization direction of the linearly polarized light and an original polarization direction is 90 degrees, so that reflected light cannot be emergent from the polarizing film. Therefore, a problem of ambient light reflection is resolved.

However, the λ/4 phase retardation film in the circular polarizer can perform a λ/4 phase retardation effect on only perpendicularly incident light whose wave length is within a set range, and usually performs a non-λ/4 phase retardation effect on obliquely incident light, causing color casts at a non-front viewing angle.

SUMMARY

In one aspect, an embodiment of the present disclosure provides an organic light emitting display panel. The display panel includes: a substrate, a plurality of organic light emitting diode elements in an array on one side of the substrate, a phase compensation film on a side of the organic light emitting diode elements away from the substrate, and a circular polarizer on a side of the phase compensation film away from the organic light emitting diode elements, wherein the phase compensation film is configured to compensate for a phase of light obliquely incident to the circular polarizer, so that a difference between a phase retardation amount of the light obliquely passing through the circular polarizer and the phase compensation film and a phase retardation amount of light perpendicularly passing through the circular polarizer and the phase compensation film is less than a preset value.

In a possible implementation, in the organic light emitting display panel according to this embodiment of the present disclosure, the phase compensation film includes a first reactive liquid crystal layer and first alignment layers on two sides of the first reactive liquid crystal layer; and alignment directions of the first alignment layers are perpendicular to a plane where the first reactive liquid crystal layer is located.

In a possible implementation, in the organic light emitting display panel according to this embodiment of the present disclosure, the circular polarizer includes a linear polarizer and a λ/4 phase retardation film, wherein the λ/4 phase retardation film is located between the linear polarizer and the phase compensation film.

In a possible implementation, in the organic light emitting display panel according to this embodiment of the present disclosure, the λ/4 phase retardation film includes a second reactive liquid crystal layer and second alignment layers on two sides of the second reactive liquid crystal layer; and alignment directions of the second alignment layers are parallel to a plane where the second reactive liquid crystal layer is located; and an angle between an optical axis of the second reactive liquid crystal layer and a polarization direction of the linear polarizer is 45 degrees.

In a possible implementation, in the organic light emitting display panel according to this embodiment of the present disclosure, liquid crystals in the first reactive liquid crystal layer and the second reactive liquid crystal layer are polymer liquid crystals.

In a possible implementation, in the organic light emitting display panel according to this embodiment of the present disclosure, the λ/4 phase retardation film is a λ/4 wave plate; and an angle between a fast axis of the λ/4 wave plate and a polarization direction of the linear polarizer is 45 degrees.

In a possible implementation, in the organic light emitting display panel according to this embodiment of the present disclosure, an angle between a polarization direction of the linear polarizer and the horizontal direction is 0 to 45 degrees, or 135 to 180 degrees.

In a possible implementation, in the organic light emitting display panel according to this embodiment of the present disclosure, the linear polarizer includes a linear polarizing layer and protection layers on two sides of the linear polarizing layer.

In a possible implementation, in the organic light emitting display panel according to this embodiment of the present disclosure, the organic light emitting display panel further includes an encapsulation layer between the organic light emitting diode elements and the phase compensation film, and a driver circuit layer between the substrate and the organic light emitting diode elements.

In a possible implementation, the organic light emitting diode element includes an anode on a side of the driver circuit layer away from the substrate, a cathode on a side of the encapsulation layer away from the phase compensation film, and a light-emitting layer between the anode and the cathode.

In another aspect, an embodiment of the present disclosure provides a display device, including any one of the foregoing organic light emitting display panels.

DETAILED DESCRIPTION

Embodiments of the present disclosure provide an organic light emitting display panel and a display device, to avoid color casts in displaying at large viewing angles.

To make the objects, technical solutions, and advantages of the present disclosure clearer, the disclosure will be described in details with reference to the accompanying drawings. Apparently the embodiments to be described are merely some but not all of the embodiments of the present disclosure. All other embodiments obtained by those ordinarily skilled in the art based on the embodiments of the present disclosure without creative efforts shall fall within the protection scope of the present disclosure.

Implementations of an organic light emitting display panel and a display device according to embodiments of the disclosure will be described below in details with reference to the drawings.

Figure 1:
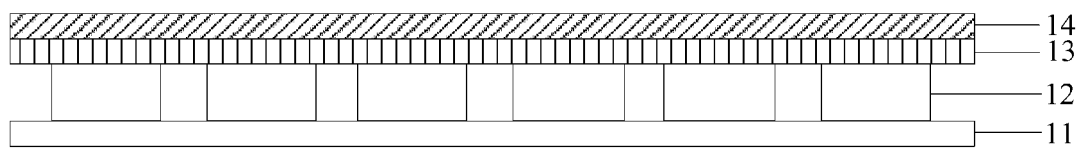
FIG. 1 is a schematic structural diagram of a cross section of an organic light emitting display panel according to an embodiment of the present disclosure.

As shown in FIG. 1, the organic light emitting display panel provided in this embodiment of the present disclosure includes a substrate 11, a plurality of organic light emitting diode elements 12 in an array located on one side of the substrate, a phase compensation film 13 located on a side of the organic light emitting diode elements 12 away from the substrate 11, and a circular polarizer 14 located on a side of the phase compensation film 13 away from the organic light emitting diode elements 12.

The phase compensation film 13 is configured to compensate for a phase of light obliquely incident to the circular polarizer 14, so that a difference between a phase retardation amount of light obliquely passing through the circular polarizer 14 and the phase compensation film 13 and a phase retardation amount of light perpendicularly passing through the circular polarizer 14 and the phase compensation films 13 is less than a preset value.

During actual application, because electrodes of the organic light emitting diode elements 12 have a reflection function, ambient light incident to the interior of the organic light emitting display panel may be reflected by the electrodes, resulting in a display contrast decrease. The circular polarizer 14 is arranged to achieve an anti-ambient light reflection function. However, during production of the circular polarizer 14, a phase retardation amount of the circular polarizer 14 to only perpendicularly incident light that is within a set band can be $(m+\frac{1}{4})\lambda$, wherein m is an integer, and a phase retardation amount of the circular polarizer 14 to obliquely incident light is not $(m+\frac{1}{4})\lambda$, causing color casts when the organic light emitting display panel is viewed at a large viewing angle. Therefore, in the organic light emitting display panel according to the embodiments of the present disclosure, the phase compensation film 13 is arranged on the side of the organic light emitting diode elements 12 away from the substrate 11, and the phase compensation film 13 compensates for phase retardation amounts generated by the circular polarizer 14 at all viewing angles, so that a phase retardation amount of light obliquely passing through the circular polarizer 14 and the phase compensation film 13 is substantially consistent with that of light perpendicularly passing through the circular polarizer 14 and the phase compensation film 13, and all phase retardation amounts of light at a front viewing angle and large viewing angles are substantially $(m+\frac{1}{4})\lambda$. In this way, color casts of the organic light emitting display panel during large viewing angle observation can be avoided, the display effect can be improved, and better viewing experience is brought for a viewer.

Figure 2:
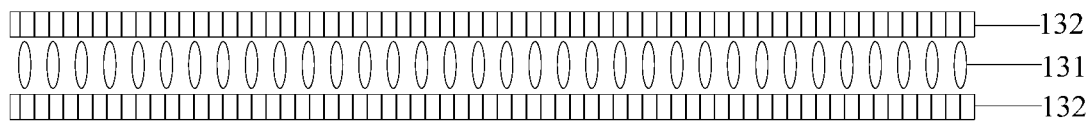
FIG. 2 is a schematic structural diagram of a cross section of a phase compensation film according to an embodiment of the present disclosure.

In some embodiments, as shown in FIG. 2, the phase compensation film 13 includes a first reactive liquid crystal layer 131 and first alignment layers 132 on two sides of the first reactive liquid crystal layer 131, wherein alignment directions of the first alignment layers 132 are perpendicular to a plane where the first reactive liquid crystal layer 131 is located.

The first reactive liquid crystal layer 131 in the phase compensation film 13 according to this embodiment of the present disclosure may include polymeric liquid crystals having a self-alignment function. Two ends of the polymeric liquid crystal include photo-polymerization reactive groups. When ultraviolet light irradiates on the reactive groups, a polymerization reaction may occur. Self-alignment is performed on the polymeric liquid crystal, wherein direction of the self-alignment is the same as the alignment directions of the first alignment layers 132, and an optical axis of the polymeric liquid crystal layer is parallel to the alignment directions.

Figure 3A:
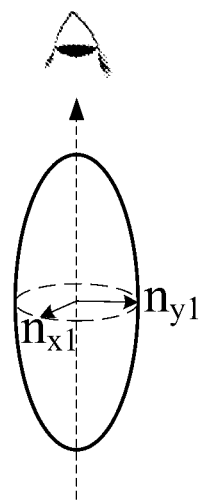
FIG. 3A and FIG. 3B are operating principle diagrams of a first reactive liquid crystal layer according to embodiments of the present disclosure.
Figure 3B:
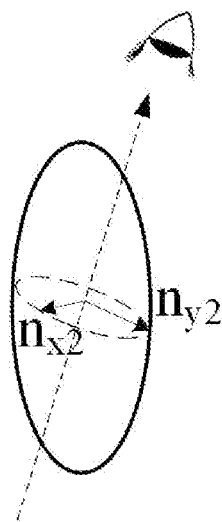

Operating principle diagrams of the phase compensation film 13 in this embodiment of the present disclosure are shown in FIG. 3A and FIG. 3B. FIG. 3A shows a refractive index characteristic of a liquid crystal molecule when the first reactive liquid crystal layer is viewed at a front viewing angle; and FIG. 3B shows a refractive index characteristic of a liquid crystal molecule when the first reactive liquid crystal layer is viewed at a large viewing angle. Specifically, during front viewing angle observation, a phase retardation amount of the circular polarizer to light is $(m+\frac{1}{4})\lambda$. In this case, as shown in FIG. 3A, the refractive index is decomposed, by the liquid crystal molecule of the first reactive liquid crystal layer, to $n_{x1}$ and $n_{y1}$ in a plane that is perpendicular to light emergent to human eye. During front viewing angle observation, $n_{x1}=n_{y1}$, and a phase difference generated by the first reactive liquid crystal layer at a front viewing angle is $2\pi\Delta n1d/\lambda = 2\pi(n_{x1}-n_{y1})d/\lambda = 0$. Therefore, a total phase retardation amount generated after light perpendicularly passes through the circular polarizer and the phase compensation film is $(m+\frac{1}{4})\lambda$. However, during large viewing angle observation, a phase retardation amount of the circular polarizer to light is usually greater than $(m+\frac{1}{4})\lambda$, in this way, as shown in FIG. 3B, the refractive index is decomposed, by the liquid crystal molecule of the first reactive liquid crystal layer, to $n_{x2}$ and $n_{y2}$ in a plane that is perpendicular to light emergent to human eyes, wherein $n_{x1}=n_{x2}$, and $n_{y1}<n_{y2}$. During large viewing angle observation, $n_{x2} < n_{y2}$, a phase difference generated by the first reactive liquid crystal layer at a large viewing angle is $2\pi\Delta n2 d/\lambda = 2\pi(nx2-ny2)d/\lambda < 0$. A total phase retardation amount generated by light obliquely passing through the circular polarizer and the phase compensation film may still substantially remain at $(m+¼)\lambda$. Therefore, phase retardation amount caused when the circular polarizer and the phase compensation film are at a front viewing angle is substantially equal to that caused when the circular polarizer and the phase compensation film are at a large viewing angle, and color casts caused by different phase retardation amounts are avoided.

Figure 4:
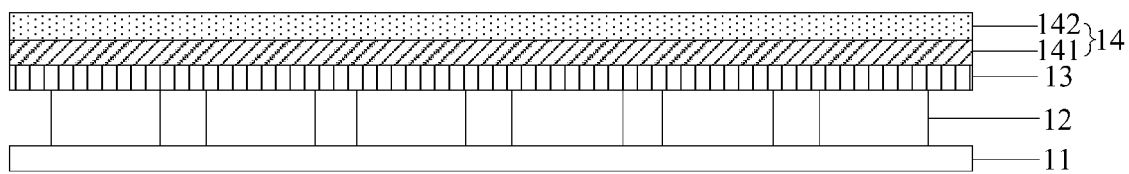
FIG. 4 is another schematic structural diagram of a cross section of an organic light emitting display panel according to an embodiment of the present disclosure.

In some embodiments, as shown in FIG. 4, in the organic light emitting display panel according to this embodiment of the present disclosure, the circular polarizer 14 includes a $\lambda/4$ phase retardation film 141 and a linear polarizer 142, wherein the $\lambda/4$ phase retardation film 141 is located between the linear polarizer 142 and the phase compensation film 13.

Figure 5:
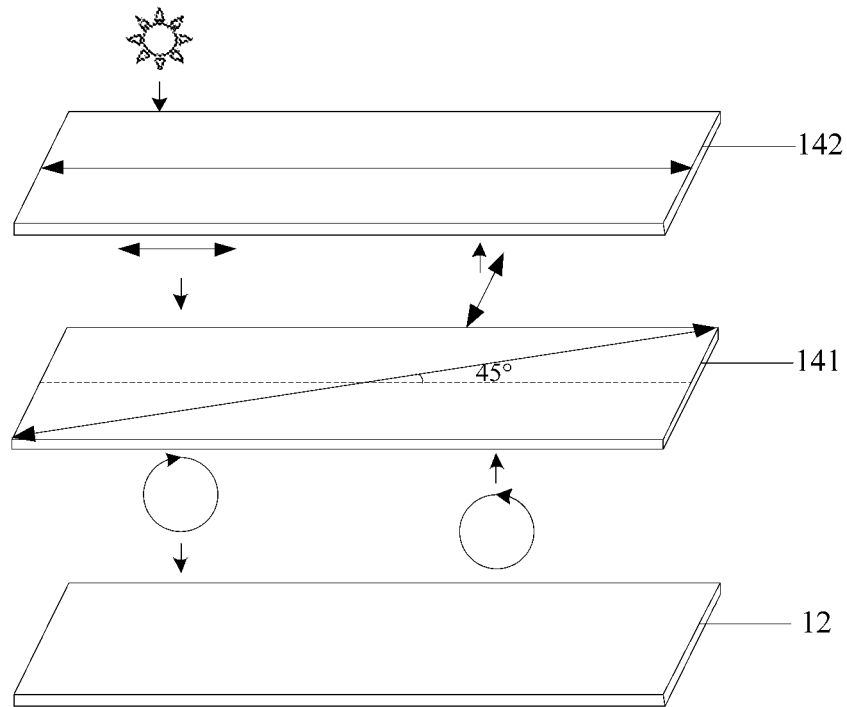
FIG. 5 is an operating principle diagram of a circular polarizer according to an embodiment of the present disclosure.

During specific implementation, on the premise that the function of the phase compensation film 13 is not taken into consideration, a principle of an anti-ambient light reflection function of the circular polarizer 14 is shown in FIG. 5. For convenience of comparison, an incident light path and a reflected light path are represented by two locations in FIG. 5, wherein the left side location represents the incident light path, and the right side location represents the reflected light path. Specifically, when being incident to the interior of the organic light emitting display panel, ambient light (which is natural light) first transmits to the linear polarizer 142, and only light that conforms with a polarization direction of the linear polarizer 142 can pass. In an example scenario shown in FIG. 5, the polarization direction of the linear polarizer 142 is a horizontal direction represented by an arrow. After passing through the linear polarizer 142, the ambient light is converted into linearly polarized light whose polarization direction is the horizontal direction; and after passing through the $\lambda/4$ phase retardation film 141, the linearly polarized light is converted into circularly polarized light. In the example scenario shown in FIG. 5, the ambient light is converted into right-hand circularly polarized light after passing through the linear polarizer 142 and the $\lambda/4$ phase retardation film 141; after reflecting by the organic light emitting diode element 12, the right-hand circularly polarized light is converted into left-hand circularly polarized light; then after passing through the $\lambda/4$ phase retardation film 141, linearly polarized light is formed, and a polarization direction of the linearly polarized light is perpendicular to a polarization direction of the linear polarizer 142, and the linearly polarized light cannot be emergent from the linear polarizer 142, thereby achieving the anti-reflection function.

Although the circular polarizer can achieve the anti-ambient light reflection function, a phase retardation structure of the circular polarizer has different phase retardation functions on emergent light at different viewing angles. Therefore, in the organic light emitting display panel according to this embodiment of the present disclosure, the phase compensation film 13 is additionally arranged between the circular polarizer 14 and the organic light emitting diode element 12, to compensate a phase generated by the circular polarizer 14 on obliquely passed light, so that phase retardation amounts of light at a front viewing angle and at large viewing angles are substantially consistent, and color casts of large viewing angle displaying are avoided.

Figure 6:
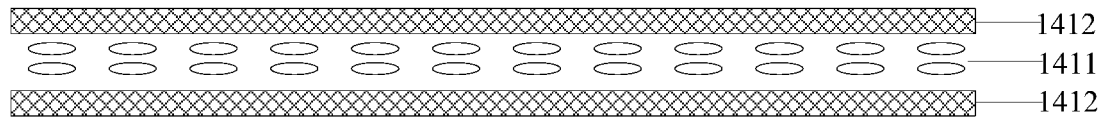
FIG. 6 is a schematic structural diagram of a cross section of a λ/4 phase retardation film according to an embodiment of the present disclosure.

During actual application, in a possible implementation, as shown in FIG. 6, the $\lambda/4$ phase retardation film 141 may include a second reactive liquid crystal layer 1411 and second alignment layers 1412 on two sides of the second reactive liquid crystal layer 1411, wherein alignment directions of the second alignment layers 1412 are parallel to a plane wherein the second reactive liquid crystal layer 1411 is located; and an angle between an optical axis of the second reactive liquid crystal layer 1411 and a polarization direction of the linear polarizer is 45 degrees.

The second reactive liquid crystal layer 1411 in the $\lambda/4$ phase retardation film 141 may be polymeric liquid crystal the same as that of the first reactive liquid crystal layer 131. Two ends of the polymeric liquid crystal include polymerization reactive groups. When ultraviolet light irradiates on the reactive groups, a polymerization reaction may occur, and an optical self-alignment purpose is achieved. An optical axis of the second reactive liquid crystal layer 1411 is the same as an alignment direction. In this embodiment of the present disclosure, light of the second reactive liquid crystal layer 1411 is parallel to a plane where the second reactive liquid crystal layer 1411 is located, and an angle between the optical axis of the second reactive liquid crystal layer 1411 and a polarization direction of the linear polarizer 142 is 45 degrees. In this way, linearly polarized light passing through the linear polarizer 142 may be converted into circularly polarized light under the action of the second reactive liquid crystal layer 1411. In addition, the second alignment layer 1412 may be made of a polyimide material; the first alignment layer may be made of an optical self-alignment material; the material in the first alignment layer 132 may form a vertical branched chain under vertical irradiation of ultraviolet light, to achieve an alignment function on the first reactive liquid crystal layer 131; and the second alignment layer 1412 may form a groove in a horizontal direction using a friction manner, thereby achieving an alignment function on the second reactive liquid crystal layer 1411.

Figure 7A:
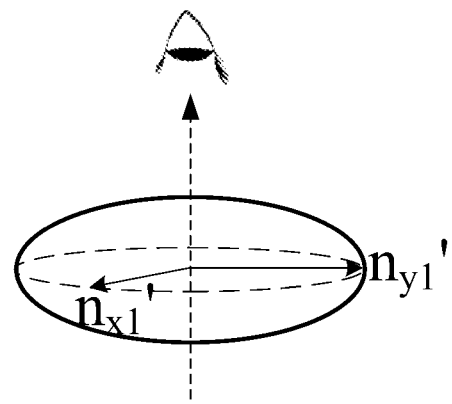
FIG. 7A and FIG. 7B are operating principle diagrams of a second reactive liquid crystal layer according to embodiments of the present disclosure.
Figure 7B:
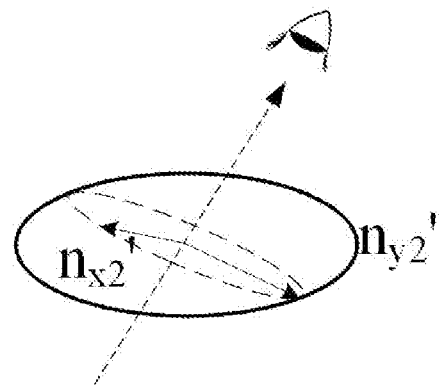

A principle when the second reactive liquid crystal layer achieves a phase retardation function on light is shown in FIG. 7A and FIG. 7B. FIG. 7A shows a refractive index characteristic of a liquid crystal molecule when the second reactive liquid crystal layer is viewed at a front viewing angle; and FIG. 7B shows a refractive index characteristic of a liquid crystal molecule when the second reactive liquid crystal layer is viewed at a large viewing angle. Specifically, during front viewing angle observation, as shown in FIG. 7A, the refractive index is decomposed, by the liquid crystal molecule of the second reactive liquid crystal layer, to $n_{x1}'$ and $n_{y1}'$ in a plane that is perpendicular to light emergent to human eyes, wherein $\Delta n_1' = n_{x1}' - n_{y1}'$. During front viewing angle observation, a phase difference generated by the second reactive liquid crystal layer is $2\pi\alpha n_1'd/\lambda = (m+¼)\lambda$, wherein m is an integer. During large-angle viewing, as shown in FIG. 7B, the refractive index is decomposed, by the liquid crystal molecule of the second reactive liquid crystal layer, to $n_{x2}'$ and $n_{y2}'$ in a plane that is perpendicular light emergent to human eyes, wherein $\Delta n_2' = n_{x2}' - n_{y2}'$. It can be known through a comparison between FIG. 7A and FIG. 7B that $n_{y2}' < n_{y1}'$, so that $\Delta n_1' < \Delta n_2'$. Therefore, during large viewing angle observation, a phase difference, generated by the second reactive liquid crystal layer at a large viewing angle is greater than $(m+¼)\lambda$, and color casts are generated when the organic light emitting display panel is viewed at a large viewing angle.

However, with reference to use of the foregoing phase compensation film 13, the first reactive liquid crystal layer whose alignment direction is vertical may perform, at a same viewing angle, a compensation function on a phase retardation amount generated by the second reactive liquid crystal layer whose alignment direction is horizontal, wherein phase compensation to the first reactive liquid crystal layer at the front viewing angle is 0, and a total phase retardation amount generated by the first reactive liquid crystal layer and the second reactive liquid crystal layer is still (m+¼)λ. However, phase compensation to the first reactive liquid crystal layer at a large viewing angle is less than 0, and a phase retardation amount generated by the second reactive liquid crystal layer is greater than (m+¼)λ, so that a total phase retardation amount generated by the first reactive liquid crystal layer and the second reactive liquid crystal layer at a large viewing angle is substantially (m+¼)λ, a total phase retardation amount generated when light obliquely passes through the circular polarizer and the phase compensation film may still remain substantially (m+¼)λ. Therefore, phase retardation amount generated by the circular polarizer is substantially equal to that generated by the phase compensation film, no matter they are at a front viewing angle or at a large viewing angle; and displaying color casts caused by different phase retardation amounts are avoided.

In another possible implementation, the λ/4 phase retardation film may directly use a λ/4 wave plate, wherein an angle between a fast axis of the λ/4 wave plate and a polarization direction of the linear polarizer is 45 degrees. For an anti-reflection principle of the combination of the λ/4 wave plate and the linear polarizer, refer to FIG. 5. Details are not described herein.

The organic light emitting display panel according to this embodiment of the present disclosure may be applied to vehicle-mounted displaying. In a vehicle-mounted application scenario, to reduce luminance of ambient light, a driver may wear sun glasses. The sun glasses may be polarizing sun glasses, that is, lenses of the glasses are made of linear polarizing film, to hinder energy of a half of the ambient light, wherein the half of light is perpendicular to a polarization direction of the linear polarizing film. Generally a polarization direction of the sun glasses is the horizontal direction, and a head turning range of the driver is approximately from −45 degrees to +45 degrees. To avoid a phenomenon that the driver wearing the sun glasses cannot effectively receive light displayed by the organic light emitting display panel, a condition that the polarization direction of the sun glasses is perpendicular to the polarization direction of the linear polarizer in the organic light emitting display panel should be avoided. Therefore, in this embodiment of the present disclosure, an angle between the polarization direction of the linear polarizer 142 of the organic light emitting display panel and the horizontal direction is set to 0-45 degrees, or 135-180 degrees.

Figure 8:
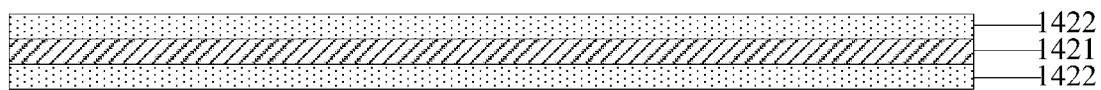
FIG. 8 is a schematic structural diagram of a cross section of a linear polarizer according to an embodiment of the present disclosure.

In addition, during specific implementation, as shown in FIG. 8, the linear polarizer 142 may include a linear polarizing layer 1421 and protection layers 1422 located on two sides of the linear polarizing layer 1421. The linear polarizing layer 1421 may be made of a polyvinyl alcohol (PVA) material; the protection layer 1422 may be made of triacetate (TAC). During actual application, the linear polarizing layer may alternatively be made of another material that has a polarizing property. The material of the linear polarizing layer is not limited herein.

Figure 9:
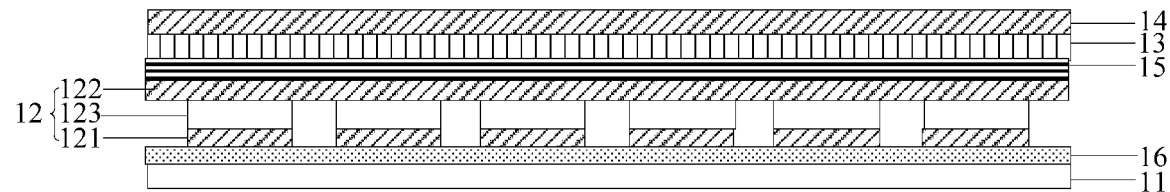
FIG. 9 is still another schematic structural diagram of a cross section of an organic light emitting display panel according to an embodiment of the present disclosure.

In some embodiments, as shown in FIG. 9, the organic light emitting display panel according to this embodiment of the present disclosure further includes an encapsulation layer 15 between the organic light emitting diode elements 12 and the phase compensation film 13, and a driver circuit layer 16 between the substrate 11 and the organic light emitting diode elements 12.

The organic light emitting diode element 12 includes an anode 121 located on a side of the driver circuit layer 16 away from the substrate 11, a cathode 122 located on a side of the encapsulation layer 15 away from the phase compensation films 13, and a light-emitting layer 123 between the anode 121 and the cathode 122.

Generally a reflective layer is arranged on the bottom side of the anode 121, configured to reflect light emitted from the light-emitting layer 123 to a side far away from the substrate, thereby realizing top emission of the organic light emitting display panel. The arrangement of the reflective layer improves light-emitting efficiency of a display panel. However, due to the arrangement of the reflective layer, ambient light incident to the interior of the organic light emitting display panel after reflection interferes with light emitted from the light-emitting layer, which reduces display contrast. Therefore, the circular polarizer 14 and the phase compensation film 13 need to be arranged on the surface of the encapsulation layer 15 of the organic light emitting display panel, to reduce ambient light reflection and avoid color casts during large viewing angle displaying. Usually, the encapsulation layer 15 may have a structure in which organic layers and inorganic layers are arranged alternatively, to isolate a light emitting material from external water and oxygen and avoid damage. The driver circuit layer 16 may include a thin film transistor (TFT) array, a storage capacitor, a driver circuit, and the like that are configured to control the organic light emitting diode elements 12, wherein one thin film transistor is configured to control one organic light emitting diode element; the thin film transistor specifically includes a gate, an active layer, a source, and a drain, wherein the drain is connected to the anode of a corresponding organic light emitting diode device through a via hole.

Based on a same idea, an embodiment of the present disclosure further provides a display device, wherein the display device includes any one of the foregoing organic light emitting display panels provided by the specific embodiments of the present disclosure. The display device may be a display device such as an organic light emitting diode (OLED) display panel, an OLED display, or an OLED TV, or may be a mobile device such as a mobile phone, a tablet, or a smart album. Because a problem-resolving principle of the display device is similar to that of the organic light emitting display panel, for implementation of the display device, reference may be made to implementation of the organic light emitting display panel. Details are not described again.

According to the organic light emitting display panel and the display device according to the embodiments of the present disclosure, the organic light emitting display panel includes a substrate, a plurality of organic light emitting diode elements in an array on one side of the substrate, a phase compensation film on a side of the organic light emitting diode elements away from the substrate, and a circular polarizer on a side of the phase compensation film away from the organic light emitting diode elements, wherein the phase compensation film is configured to compensate for a phase of light obliquely incident to the circular polarizer, so that a difference between a phase retardation amount of light obliquely passing through the circular polarizer and the phase compensation film and that of light perpendicularly passing through the circular polarizer and the phase compensation film is less than a preset value. The phase compensation film compensates for phase retardation amounts generated by the circular polarizer at all viewing angles, so that a phase retardation amount of light obliquely passing through the circular polarizer and the phase compensation film is substantially consistent with that of light perpendicularly passing through the circular polarizer and the phase compensation film. In this way, color casts of the organic light emitting display panel during large viewing angle observation can be avoided, the display effect can be improved, and better viewing experience is brought for a viewer.

Although some preferred embodiments of the present disclosure have been described, those skilled in the art can make modifications and variations to these embodiments once they know the basic inventive concept. Therefore, the following claims are intended to be construed to cover the preferred embodiments and all changes and modifications falling within the scope of the present disclosure.

Obviously, it will be apparent to those skilled in the art that various modifications and variations can be made to the present disclosure without departing from the spirit and scope of the present disclosure. Thus, if these modifications and variations of the present disclosure belong to the scopes of claims of the present disclosure and their equivalent techniques, then the present disclosure is also intended to include these modifications and variations.

The invention claimed is:

1. An organic light emitting display panel, comprising: a substrate, a plurality of organic light emitting diode elements in an array on one side of the substrate, a phase compensation film on a side of the organic light emitting diode elements away from the substrate, and a circular polarizer on a side of the phase compensation film away from the organic light emitting diode elements;
   wherein the phase compensation film is configured to compensate for a phase of light obliquely incident to the circular polarizer, so that a difference between a phase retardation amount of the light obliquely passing through the circular polarizer and the phase compensation film and a phase retardation amount of light perpendicularly passing through the circular polarizer and the phase compensation film is less than a preset value;
   wherein the circular polarizer comprises a linear polarizer and a $\lambda/4$ phase retardation film, wherein the $\lambda/4$ phase retardation film is located between the linear polarizer and the phase compensation film; and
   wherein the phase compensation film comprises a first reactive liquid crystal layer and first alignment layers on two sides of the first reactive liquid crystal layer;
   liquid crystals in the first reactive liquid crystal layer are polymeric liquid crystals provided with a self-alignment function;
   the first alignment layers are made of an optical self-alignment material; and
   alignment directions of the first alignment layers are same as self-alignment directions of the polymeric liquid crystals in the first reactive liquid crystal layer and are perpendicular to a plane where the first reactive liquid crystal layer is located.

2. The organic light emitting display panel according to claim 1, wherein the $\lambda/4$ phase retardation film comprises a second reactive liquid crystal layer and second alignment layers on two sides of the second reactive liquid crystal layer; and alignment directions of the second alignment layers are parallel to a plane where the second reactive liquid crystal layer is located; and
   an angle between an optical axis of the second reactive liquid crystal layer and a polarization direction of the linear polarizer is 45 degrees.

3. The organic light emitting display panel according to claim 2, wherein liquid crystals in the second reactive liquid crystal layer are polymer liquid crystals provided with a self-alignment function.

4. The organic light emitting display panel according to claim 1, wherein the $\lambda/4$ phase retardation film is a $\lambda/4$ wave plate; and
   an angle between a fast axis of the $\lambda/4$ wave plate and a polarization direction of the linear polarizer is 45 degrees.

5. The organic light emitting display panel according to claim 1, wherein an angle between a polarization direction of the linear polarizer and a horizontal direction is 0 to 45 degrees, or 135 to 180 degrees.

6. The organic light emitting display panel according to claim 1, wherein the linear polarizer comprises a linear polarizing layer and protection layers on two sides of the linear polarizing layer.

7. The organic light emitting display panel according to claim 1, further comprising: an encapsulation layer between the organic light emitting diode elements and the phase compensation film, and a driver circuit layer between the substrate and the organic light emitting diode elements.

8. The organic light emitting display panel according to claim 7, wherein the organic light emitting diode element comprise an anode on a side of the driver circuit layer away from the substrate, a cathode on a side of the encapsulation layer away from the phase compensation film, and a light-emitting layer between the anode and the cathode.

9. A display device, comprising the organic light emitting display panel according to claim 1.

10. The organic light emitting display panel according to claim 2, wherein each of the second alignment layers is made of a polyimide material.

* * * * *